United States Patent
Kugler et al.

(10) Patent No.: US 9,960,352 B2
(45) Date of Patent: May 1, 2018

(54) METHOD OF DOPING AN ORGANIC SEMICONDUCTOR AND DOPING COMPOSITION

(71) Applicants: Cambridge Display Technology Limited, Godmanchester (GB); Sumitomo Chemical Company Limited, Tokyo (JP)

(72) Inventors: Thomas Kugler, Cambridge (GB); Sheena Zuberi, Godmanchester (GB)

(73) Assignees: Cambridge Display Technology Limited, Cambridgeshire (GB); Sumitomo Chemical Corporation Limited, Tokyo (JP)

( * ) Notice: Subject to any disclaimer, the term of this patent is extended or adjusted under 35 U.S.C. 154(b) by 0 days. days.

(21) Appl. No.: 15/219,717

(22) Filed: Jul. 26, 2016

(65) Prior Publication Data

US 2017/0033286 A1 Feb. 2, 2017

(30) Foreign Application Priority Data

Jul. 31, 2015 (GB) .................................. 1513608.8

(51) Int. Cl.
*H01L 51/00* (2006.01)
*H01L 51/50* (2006.01)
(Continued)

(52) U.S. Cl.
CPC .......... *H01L 51/002* (2013.01); *C08G 61/126* (2013.01); *H01L 51/0003* (2013.01); *H01L 51/0027* (2013.01); *H01L 51/5004* (2013.01); *H01L 51/5092* (2013.01); *C08G 61/123* (2013.01); *C08G 73/00* (2013.01); *C08G 2261/124* (2013.01); *C08G 2261/1412* (2013.01); *C08G 2261/3142* (2013.01);
(Continued)

(58) Field of Classification Search
CPC ............... H01L 51/002; H01L 51/0003; H01L 51/0027; H01L 51/0026; H01L 51/0035; H01L 51/0036; H01L 51/0039; H01L 51/0043; H01L 51/0072; H01L 51/5004; H01L 51/5092; C08G 61/00; C08G 73/00
See application file for complete search history.

(56) References Cited

U.S. PATENT DOCUMENTS

2014/0070178 A1  3/2014  Lee et al.

FOREIGN PATENT DOCUMENTS

| GB | 2 379 085 A | 2/2003 |
|----|-------------|--------|
| WO | WO 2008/043512 A2 | 4/2008 |
| WO | WO 2011/127075 A1 | 10/2011 |

OTHER PUBLICATIONS

Combined Search and Examination Report for parent application GB1513608.8, dated Feb. 3, 2016, pp. 1-8.
(Continued)

*Primary Examiner* — Armando Rodriguez
(74) *Attorney, Agent, or Firm* — Wolf, Greenfield & Sacks, P.C.

(57) ABSTRACT

A method of forming a n-doped semiconductor layer wherein a film comprising an organic semiconductor and an n-dopant reagent is irradiated by light having a wavelength that is within an absorption range of the organic semiconductor, and wherein an absorption maximum wavelength of the n-dopant precursor is shorter than any peak wavelength of the light. The n-doped semiconductor layer may be an electron-injection layer of an organic light-emitting device.

9 Claims, 5 Drawing Sheets

(51) Int. Cl.
    *C08G 73/00* (2006.01)
    *C08G 61/12* (2006.01)
(52) U.S. Cl.
    CPC ........ *C08G 2261/3223* (2013.01); *C08G 2261/3246* (2013.01); *C08G 2261/514* (2013.01); *C08G 2261/792* (2013.01); *C08G 2261/95* (2013.01); *H01L 51/0026* (2013.01); *H01L 51/0035* (2013.01); *H01L 51/0036* (2013.01); *H01L 51/0039* (2013.01); *H01L 51/0043* (2013.01); *H01L 51/0072* (2013.01); *H01L 2251/552* (2013.01)

(56) References Cited

OTHER PUBLICATIONS

Peng Wei et al., Use of a 1 H-Benzoimidazole Derivative as an n-Type Dopant and to Enable Air-Stable Solution-Processed n-Channel Organic Thin-Film Transistors, J. Am. Chem. Soc., vol. 132, No. 26, Apr. 2010, pp. 8852-8853.

METHOD OF DOPING AN ORGANIC SEMICONDUCTOR AND DOPING COMPOSITION

RELATED APPLICATIONS

This application claims the benefits under 35 U.S.C. § 119(a)-(5 d) or 35 U.S.C. § 365(b) of United Kingdom application number GB1513608.8, filed Jul. 31 2015, the entirety of which is incorporated herein.

BACKGROUND OF THE INVENTION

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An organic light-emitting device has a substrate carrying an anode, a cathode and an organic light-emitting layer containing a light-emitting material between the anode and cathode.

In operation, holes are injected into the device through the anode and electrons are injected through the cathode. Holes in the highest occupied molecular orbital (HOMO) and electrons in the lowest unoccupied molecular orbital (LUMO) of the light-emitting material combine to form an exciton that releases its energy as light.

Cathodes include a single layer of metal such as aluminium, a bilayer of calcium and aluminium as disclosed in WO 98/10621; and a bilayer of a layer of an alkali or alkali earth compound and a layer of aluminium as disclosed in L. S. Hung, C. W. Tang, and M. G. Mason, Appl. Phys. Lett. 70, 152 (1997).

An electron-transporting or electron-injecting layer may be provided between the cathode and the light-emitting layer.

Bao et al, "Use of a 1H-Benzoimidazole Derivative as an n-Type Dopant and To Enable Air-Stable Solution-Processed n-Channel Organic Thin-Film Transistors" J. Am. Chem. Soc. 2010, 132, 8852-8853 discloses doping of [6,6]-phenyl $C_{61}$ butyric acid methyl ester (PCBM) by mixing (4-(1,3-dimethyl-2,3-dihydro-1H-benzoimidazol-2-yl)phenyl)dimethylamine (N-DMBI) with PCBM and activating the N-DMBI by heating.

US 2014/070178 discloses an OLED having a cathode disposed on a substrate and an electron-transporting layer formed by thermal treatment of an electron-transporting material and N-DMBI. It is disclosed that a radical formed on thermal treatment of N-DMBI may be a n-dopant.

U.S. Pat. No. 8,920,944 discloses n-dopant precursors for doping organic semiconductive materials.

SUMMARY OF THE INVENTION

In a first aspect the invention provides a method of forming a n-doped semiconductor layer wherein a film comprising an organic semiconductor and an n-dopant reagent is irradiated by light having a wavelength that is within an absorption range of the organic semiconductor, and wherein an absorption maximum wavelength of the n-dopant reagent is shorter than any peak wavelength of the light.

In a second aspect the invention provides a method of forming a n-doped layer of an organic electronic device wherein the n-doped layer is formed according to the first aspect.

In a third aspect the invention provides a composition comprising: (a) an organic semiconductor comprising a unit comprising one or more of a C=N group, a nitrile group, a C=O group and a C=S group and (b) an n-dopant reagent comprising a 2,3-dihydro-benzoimidazole group.

The organic semiconductor comprising a unit comprising one or more of a C=N group, a nitrile group, a C=O group and a C=S group and the n-dopant reagent comprising a 2,3-dihydro-benzoimidazole group of this third aspect may be as described anywhere herein.

In a fourth aspect the invention provides a method of forming a n-doped semiconductor layer from a composition according to the third aspect, the method comprising the step of exciting the organic semiconductor. The composition according to the third aspect may be excited by electromagnetic irradiation, optionally with light as described with reference to the first aspect, or by thermal treatment.

"n-dopant reagent" as used herein means a material that dopes the organic semiconductor to a greater extent upon excitation of the organic semiconductor (optionally by irradiation as described herein) as compared to the extent of doping without excitation of the organic semiconductor at 25° C.

Preferably, the extent of doping is at least 10, optionally at least 100, times greater upon excitation of the organic semiconductor as determined by electron-only device measurement. Preferably, there is little or no doping without excitation of the organic semiconductor at 25° C.

DESCRIPTION OF THE DRAWINGS

The invention will now be described in more detail with reference to the drawings in which.

DETAILED DESCRIPTION OF THE INVENTION

Figure 1:
FIG. 1 illustrates schematically an OLED according to an embodiment of the invention.

FIG. 1, which is not drawn to any scale, illustrates an OLED 100 according to an embodiment of the invention supported on a substrate 101, for example a glass or plastic substrate. The OLED 100 comprises an anode 103, a light-emitting layer 105, an electron-injecting layer 107 and a cathode 109.

The anode 103 may be single layer of conductive material or may be formed from two or more conductive layers. Anode 103 may be a transparent anode, for example a layer of indium-tin oxide. A transparent anode 103 and a transparent substrate 101 may be used such that light is emitted through the substrate. The anode may be opaque, in which case the substrate 101 may be opaque or transparent, and light may be emitted through a transparent cathode 109.

Light-emitting layer 105 contains at least one light-emitting material. Light-emitting material 105 may consist of a single light-emitting compound or may be a mixture of more than one compound, optionally a host doped with one or more light-emitting dopants. Light-emitting layer 105 may contain at least one light-emitting material that emits phosphorescent light when the device is in operation, or at least one light-emitting material that emits fluorescent light when the device is in operation. Light-emitting layer 105 may contain at least one phosphorescent light-emitting material and at least one fluorescent light-emitting material.

Electron-injecting layer 107 comprises or consists of a n-doped semiconductor. Cathode 109 is formed of at least one layer, optionally two or more layers, for injection of electrons into the device.

The OLED 100 may contain one or more further layers between the anode 103 and the cathode 109, for example one or more charge-transporting, charge-blocking or charge-injecting layers. Preferably, the device comprises a hole-injection layer comprising a conducting material between the anode and the light emitting layer 105. Preferably, the device comprises a hole-transporting layer comprising a semiconducting hole-transporting material between the anode 103 and the light emitting layer 105.

"Conducting material" as used herein means a material having a work function, for example a metal or a degenerate semiconductor.

"Semiconductor" as used herein means a material having a HOMO and a LUMO level, and a semiconductor layer is a layer comprising a semiconducting material or consisting of one or more semiconducting materials.

The electron-injecting layer is formed by forming a film of an organic semiconductor (acceptor material) and an n-dopant reagent and irradiating the film with light from a light source having a peak wavelength that is longer than an absorption maximum wavelength of the n-dopant reagent.

Preferably, the peak wavelength of the organic semiconductor as described herein is the peak showing strongest absorption in the absorption spectrum in the range of 400-700 nm. Preferably, the strongest absorption of the n-dopant reagent is at a wavelength below 400 nm.

The n-dopant reagent has a HOMO level that is deeper (further from vacuum) than the LUMO level of the organic semiconductor. Optionally, the n-dopant reagent has a HOMO level that is at least 1 eV deeper (further from vacuum) than the LUMO level of the organic semiconductor. Accordingly, little or no spontaneous doping occurs upon mixing of the organic semiconductor and the n-dopant reagent at room temperature.

However, the present inventors have surprisingly found that exposure of the film to electromagnetic radiation as described herein results in n-doping and that the electromagnetic radiation need not be at a wavelength that can be absorbed by the n-dopant reagent. The light emitted from the light source suitably overlaps with an absorption feature, for example an absorption peak or shoulder, of the organic semiconductor's absorption spectrum. Optionally, the light emitted from the light source has a peak wavelength within 25 nm, 10 nm or 5 nm of an absorption maximum wavelength of the organic semiconductor, however it will be appreciated that a peak wavelength of the light need not coincide with an absorption maximum wavelength of the organic semiconductor.

The extent of doping may be controlled by one or more of: the organic semiconductor/n-dopant reagent ratio; the peak wavelength of the light; the duration of irradiation of the film; and the intensity of the light. It will be appreciated that excitation will be most efficient when a peak wavelength of the light coincides with an absorption maximum of the organic semiconductor.

Optionally, irradiation time is between 1 second and 1 hour, optionally between 1-30 minutes.

Preferably, the light emitted from the light source is in the range 400-700 nm. Preferably, the electromagnetic radiation has a peak wavelength greater than 400 nm, optionally greater than 420 nm, optionally greater than 450 nm. Optionally, there is no overlap between an absorption peak in the absorption spectrum of the n-dopant reagent and the wavelength(s) of light emitted from the light source. It will be appreciated that the n-dopant reagent forms a cation in the course of doping the organic semiconductor. The semi-occupied molecular orbital (SOMO) of a radical which can be formed by electrochemical reduction of this cation may be considered an indicator of the doping strength of the n-dopant reagent. Preferably, the SOMO of this radical is no more than 0.5 eV deeper than the LUMO of the organic semiconductor. Optionally, the n-dopant reagent may have a SOMO level than is the same as or shallower than the LUMO level of the organic semiconductor. Optionally, the the n-dopant reagent may have a semi-occupied molecular orbital (SOMO) level that is at least 0.05 eV deeper than the LUMO level of the organic semiconductor. Optionally, the radical has a SOMO level of less than (shallower than) about 3.0 eV from vacuum level.

Optionally, the organic semiconductor has a LUMO level of no more than 3.2 eV from vacuum level, optionally no more than 3.1 or 3.0 eV from vacuum level.

Any suitable electromagnetic radiation source may be used to irradiate the film including, without limitation, fluorescent tube, incandescent bulb and organic or inorganic LEDs. Optionally, the electromagnetic radiation source is an array of inorganic LEDs. The electromagnetic radiation source may produce radiation having one or more than one peak wavelengths.

Preferably, the electromagnetic radiation source has a light output of at least 2000 mW, optionally at least 3000 mW, optionally at least 4000 mW.

Preferably, no more than 10% or no more than 5% of the light output of the electromagnetic radiation source is from radiation having a wavelength less than or equal to 400 nm, optionally less than or equal to 420 nm. Preferably, none of the light output has a wavelength of less than or equal to 400 nm, optionally less than or equal to 420 nm.

Inducing n-doping without exposure to short wavelength light, such as UV light, may avoid damage to the materials of the OLED.

The n-doped organic semiconductor may be an extrinsic or degenerate semiconductor.

In manufacture of an organic electronic device, such as an OLED as described in FIG. 1, the irradiation step may take place during device formation or after the device has been formed. Preferably, irradiation takes place after the device has been formed and encapsulated. The device may be manufactured in an environment in which the film is exposed to little or no wavelengths of light that induce n-doping until after encapsulation of the device, for example an environment illuminated by light having a longer wavelength than that of the electromagnetic radiation source such as a clean room illuminated with yellow light.

In the case of an OLED as described in FIG. 1, the film of the n-dopant reagent and organic semiconductor 107 may be formed over organic light-emitting layer 105 and the cathode 109 may be formed over the film.

The film may then be irradiated through the anode 101, in the case of a device formed on a transparent substrate 101 and having a transparent anode 103, such as ITO, or the film may be irradiated through the cathode 109 in the case of a device with a transparent cathode. The wavelength used to induce n-doping may be selected to avoid wavelengths that are absorbed by layers of the device between the electromagnetic radiation source and the film.

Preferably, the electron-injecting layer 107 is in contact with organic light-emitting layer 105. Preferably, the film of the organic semiconductor and n-dopant reagent is formed directly on organic light-emitting layer 105.

Preferably, the doped organic semiconductor has a work function that is no more than about 1 eV, optionally 0.5 eV or 0.2 eV deeper than a LUMO of a material of the light-emitting layer, which may be a LUMO of a light-emitting material or a LUMO of a host material if the light-emitting layer comprises a mixture of a host material and a light-emitting material. Preferably, the doped organic semiconductor has a work function that is the same as or shallower than a LUMO of a material of the light-emitting layer. Optionally, the doped organic semiconductor has a work function of less than 3.0 eV, optionally around 2.1-2.8 eV.

Preferably, the cathode 109 is in contact with the electron-injecting layer 107. Preferably, the cathode is formed directly on the film of the organic semiconductor and n-dopant reagent.

The film of the organic semiconductor and n-dopant reagent may be deposited in air. Optionally, the underlying layer, preferably the organic light-emitting layer 105, is crosslinked.

The OLED 100 may be a display, optionally a full-colour display wherein the light-emitting layer 105 comprises pixels comprising red, green and blue subpixels.

The OLED 100 may be a white-emitting OLED. White-emitting OLEDs as described herein may have a CIE x coordinate equivalent to that emitted by a black body at a temperature in the range of 2500-9000K and a CIE y coordinate within 0.05 or 0.025 of the CIE y co-ordinate of said light emitted by a black body, optionally a CIE x coordinate equivalent to that emitted by a black body at a temperature in the range of 2700-6000K. A white-emitting OLED may contain a plurality of light-emitting materials, preferably red, green and blue light-emitting materials, more preferably red, green and blue phosphorescent light-emitting materials, that combine to produce white light. The light-emitting materials may all be provided in light-emitting layer 105, or one or more additional light-emitting layers may be provided.

A red light-emitting material may have a photoluminescence spectrum with a peak in the range of about more than 550 up to about 700 nm, optionally in the range of about more than 560 nm or more than 580 nm up to about 630 nm or 650 nm.

A green light-emitting material may have a photoluminescence spectrum with a peak in the range of about more than 490 nm up to about 560 nm, optionally from about 500 nm, 510 nm or 520 nm up to about 560 nm.

A blue light-emitting material may have a photoluminescence spectrum with a peak in the range of up to about 490 nm, optionally about 450-490 nm.

The photoluminescence spectrum of a material may be measured by casting 5 wt % of the material in a PMMA film onto a quartz substrate to achieve transmittance values of 0.3-0.4 and measuring in a nitrogen environment using apparatus C9920-02 supplied by Hamamatsu.

Organic Semiconductor

The organic semiconductor may be a polymeric or non-polymeric material. Preferably, the organic semiconductor is a polymer, more preferably a conjugated polymer.

Preferably, the organic semiconductor comprises a polar double or triple bond, optionally a bond selected from a C=N group, a nitrile group or a C=O group. Preferably, these polar double- or triple-bond groups are conjugated to a conjugated polymer backbone. The organic semiconductor may comprise benzothiadiazole units. The benzothiadiazole units may be units of a polymer. A polymeric repeat unit may comprise or consist of repeat units of formula:

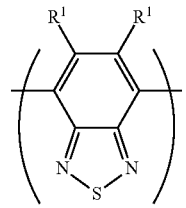

wherein $R^1$ in each occurrence is a substituent, optionally a substituent selected from alkyl, optionally $C_{1-20}$ alkyl, wherein one or more non-adjacent C atoms may be replaced with optionally substituted aryl or heteroaryl, O, S, C=O or —COO—, and one or more H atoms may be replaced with F.

A repeat unit comprising benzothiadiazole may have formula:

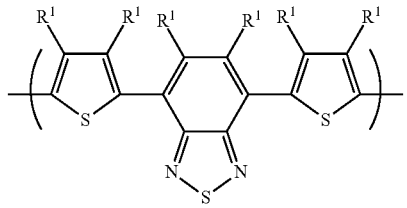

wherein $R^1$ is as described above.

The polymer may comprise repeat units comprising benzothiadiazole repeat units and arylene repeat units.

Arylene repeat units include, without limitation, fluorene, phenylene, naphthalene, anthracene, indenofluorene, phenanthrene and dihydrophenanthrene repeat units, each of which may be unsubstituted or substituted with one or more substituents.

Substituents of arylene repeat units, if present, may be selected from $C_{1-40}$ hydrocarbyl, preferably $C_{1-20}$ alkyl; phenyl which may be unsubstituted or substituted with one or more $C_{1-10}$ alkyl groups.

One preferred class of arylene repeat units is phenylene repeat units, such as phenylene repeat units of formula (VI):

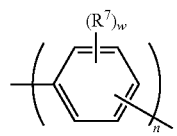
(VI)

wherein w in each occurrence is independently 0, 1, 2, 3 or 4, optionally 1 or 2; n is 1, 2 or 3; and $R^7$ independently in each occurrence is a substituent.

Where present, each $R^7$ may independently be selected from the group consisting of:
- alkyl, optionally $C_{1-20}$ alkyl, wherein one or more non-adjacent C atoms may be replaced with optionally substituted aryl or heteroaryl, O, S, C=O or —COO—, and one or more H atoms may be replaced with F; and
- a group of formula —$(Ar^7)_r$, wherein each $Ar^7$ is independently an aryl or heteroaryl group that may be unsubstituted or substituted with one or more substituents and r is at least 1, optionally 1, 2 or 3, preferably a branched or linear chain of phenyl groups each of which may be with one or more $C_{1-20}$ alkyl groups.

In the case where $R^7$ comprises an aryl or heteroaryl group, or a linear or branched chain of aryl or heteroaryl groups, the or each aryl or heteroaryl group may be substituted with one or more substituents $R^8$ selected from the group consisting of alkyl, for example $C_{1-20}$ alkyl, wherein one or more non-adjacent C atoms may be replaced with O, S, C=O and —COO— and one or more H atoms of the alkyl group may be replaced with F; fluorine; nitro; and cyano.

Preferably, each $R^7$, where present, is independently selected from $C_{1-40}$ hydrocarbyl, and is more preferably selected from $C_{1-20}$ alkyl; unsubstituted phenyl; phenyl substituted with one or more $C_{1-20}$ alkyl groups; a linear or branched chain of phenyl groups, wherein each phenyl may be unsubstituted or substituted with one or more substituents; and a crosslinkable group.

If n is 1 then exemplary repeat units of formula (VI) include the following:

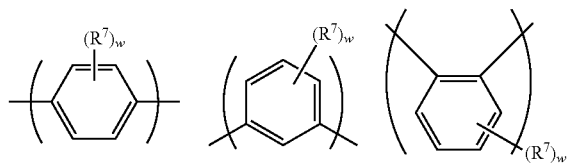

A particularly preferred repeat unit of formula (VI) has formula (VIa):

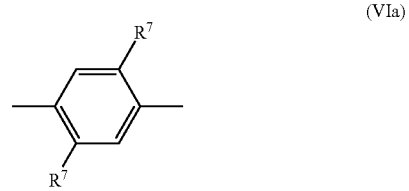
(VIa)

Substituents $R^7$ of formula (VIa) are adjacent to linking positions of the repeat unit, which may cause steric hindrance between the repeat unit of formula (VIa) and adjacent repeat units, resulting in the repeat unit of formula (VIa) twisting out of plane relative to one or both adjacent repeat units.

Exemplary repeat units where n is 2 or 3 include the following:

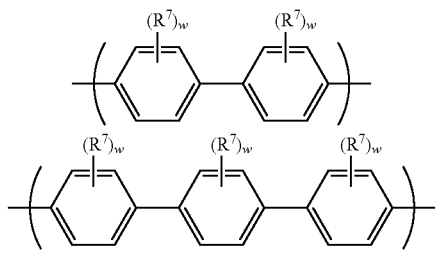

A preferred repeat unit has formula (VIb):

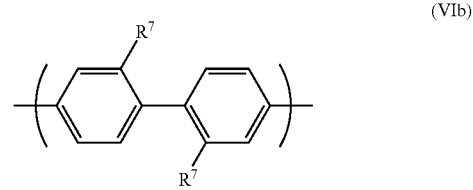
(VIb)

The two $R^7$ groups of formula (VIb) may cause steric hindrance between the phenyl rings they are bound to, resulting in twisting of the two phenyl rings relative to one another.

A further class of arylene repeat units are optionally substituted fluorene repeat units, such as repeat units of formula (VII):

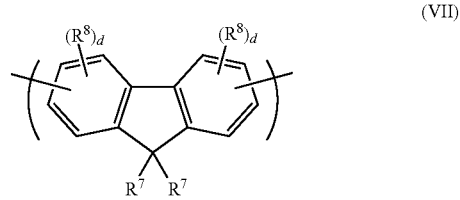
(VII)

wherein $R^7$ in each occurrence is the same or different and is a substituent as described with reference to formula (VI), and wherein the two groups $R^7$ may be linked to form a ring; $R^8$ is a substituent; and d is 0, 1, 2 or 3.

The aromatic carbon atoms of the fluorene repeat unit may be unsubstituted, or may be substituted with one or more substituents $R^8$. Exemplary substituents $R^8$ are alkyl, for example $C_{1-20}$ alkyl, wherein one or more non-adjacent C atoms may be replaced with O, S, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

The extent of conjugation of repeat units of formula (VII) to aryl or heteroaryl groups of adjacent repeat units in the polymer backbone may be controlled by (a) linking the repeat unit through the 3- and/or 6-positions to limit the extent of conjugation across the repeat unit, and/or (b)

substituting the repeat unit with one or more substituents $R^8$ in or more positions adjacent to the linking positions in order to create a twist with the adjacent repeat unit or units, for example a 2,7-linked fluorene carrying a $C_{1-20}$ alkyl substituent in one or both of the 3- and 6-positions.

The repeat unit of formula (VII) may be an optionally substituted 2,7-linked repeat unit of formula (VIIa):

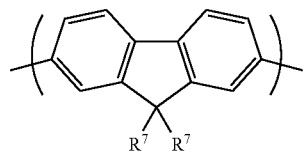

(VIIa)

Optionally, the repeat unit of formula (VIIa) is not substituted in a position adjacent to the 2- or 7-position. Linkage through the 2- and 7-positions and absence of substituents adjacent to these linking positions provides a repeat unit that is capable of providing a relatively high degree of conjugation across the repeat unit.

The repeat unit of formula (VII) may be an optionally substituted 3,6-linked repeat unit of formula (VIIb)

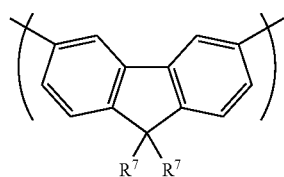

(VIIb)

The extent of conjugation across a repeat unit of formula (VIIb) may be relatively low as compared to a repeat unit of formula (VIIa).

Another exemplary arylene repeat unit has formula (VIII):

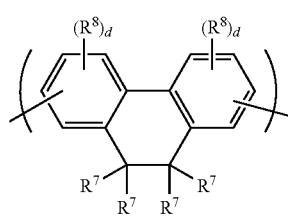

(VIII)

wherein $R^7$, $R^8$ and d are as described with reference to formula (VI) and (VII) above. Any of the $R^7$ groups may be linked to any other of the $R^7$ groups to form a ring. The ring so formed may be unsubstituted or may be substituted with one or more substituents, optionally one or more $C_{1-20}$ alkyl groups.

Polymers as described anywhere herein suitably have a polystyrene-equivalent number-average molecular weight (Mn) measured by gel permeation chromatography in the range of about $1\times10^3$ to $1\times10^8$, and preferably $1\times10^3$ to $5\times10^6$. The polystyrene-equivalent weight-average molecular weight (Mw) of polymers described anywhere herein may be $1\times10^3$ to $1\times10^8$, and preferably $1\times10^4$ to $1\times10^7$.

Polymers as described anywhere herein are suitably amorphous polymers.

n-dopant Reagent

Exemplary n-dopant reagents comprise a 2,3-dihydrobenzoimidazole group, optionally a 2,3-dihydro-1H-benzoimidazole group. The n-dopant reagent may have formula (I):

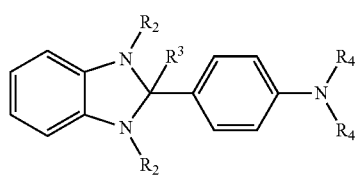

(I)

wherein:
each $R^2$ is independently a $C_{1-20}$ hydrocarbyl group, optionally a $C_{1-10}$ alkyl group;
$R^3$ is H or a $C_{1-20}$ hydrocarbyl group, optionally H, $C_{1-10}$ alkyl or $C_{1-10}$ alkylphenyl; and
each $R^4$ is independently a $C_{1-20}$ hydrocarbyl group, optionally $C_{1-10}$ alkyl, phenyl or phenyl substituted with one or more $C_{1-10}$ alkyl groups.

Exemplary n-dopant reagents include the following:

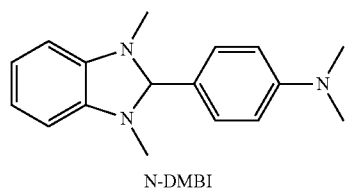

N-DMBI

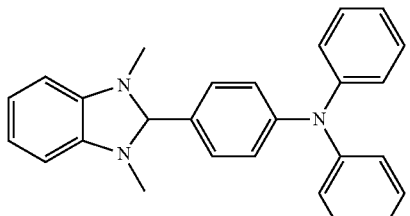

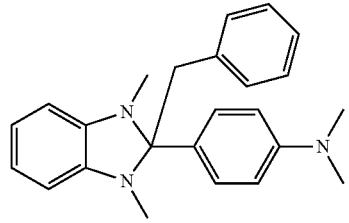

N-DMBI is disclosed in *Adv. Mater.* 2014, 26, 4268-4272, the contents of which are incorporated herein by reference.

Light-emitting Layers

The OLED 100 may contain one or more light-emitting layers.

Light-emitting materials of the OLED 100 may be fluorescent materials, phosphorescent materials or a mixture of fluorescent and phosphorescent materials. Light-emitting materials may be selected from polymeric and non-polymeric light-emitting materials. Exemplary light-emitting polymers are conjugated polymers, for example polyphenylenes and polyfluorenes examples of which are described in Bernius, M. T., Inbasekaran, M., O'Brien, J. and Wu, W., Progress with Light-Emitting Polymers. Adv. Mater., 12 1737-1750, 2000, the contents of which are incorporated herein by reference. Light-emitting layer 107 may comprise a host material and a fluorescent or phosphorescent light-emitting dopant. Exemplary phosphorescent dopants are row 2 or row 3 transition metal complexes, for example complexes of ruthenium, rhodium, palladium, rhenium, osmium, iridium, platinum or gold.

A light-emitting layer of an OLED may be unpatterned, or may be patterned to form discrete pixels. Each pixel may be further divided into subpixels. The light-emitting layer may contain a single light-emitting material, for example for a monochrome display or other monochrome device, or may contain materials emitting different colours, in particular red, green and blue light-emitting materials for a full-colour display.

A light-emitting layer may contain a mixture of more than one light-emitting material, for example a mixture of light-emitting materials that together provide white light emission. A plurality of light-emitting layers may together produce white light.

A fluorescent light-emitting layer may consist of a light-emitting material alone or may further comprise one or more further materials mixed with the light-emitting material. Exemplary further materials may be selected from hole-transporting materials; electron-transporting materials and triplet-accepting materials, for example a triplet-accepting polymer as described in WO 2013/114118, the contents of which are incorporated herein by reference.

Cathode

The cathode may comprise one or more layers. Preferably, the cathode comprises or consists of a layer in contact with the electron injecting layer that comprises or consists of one or more conductive materials. Exemplary conductive materials are metals, preferably metals having a work function of at least 4 eV, optionally aluminium, copper, silver or gold or iron. Exemplary non-metallic conductive materials include conductive metal oxides, for example indium tin oxide and indium zinc oxide, graphite and graphene. Work functions of metals are as given in the CRC Handbook of Chemistry and Physics, 12-114, 87$^{th}$ Edition, published by CRC Press, edited by David R. Lide. If more than one value is given for a metal then the first listed value applies.

The cathode may be opaque or transparent. Transparent cathodes are particularly advantageous for active matrix devices because emission through a transparent anode in such devices is at least partially blocked by drive circuitry located underneath the emissive pixels.

It will be appreciated that a transparent cathode device need not have a transparent anode (unless a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Hole-transporting Layer

A hole transporting layer may be provided between the anode 103 and the light-emitting layer 105.

The hole-transporting layer may be cross-linked, particularly if an overlying layer is deposited from a solution. The crosslinkable group used for this crosslinking may be a crosslinkable group comprising a reactive double bond such and a vinyl or acrylate group, or a benzocyclobutane group. Crosslinking may be performed by thermal treatment, preferably at a temperature of less than about 250° C., optionally in the range of about 100-250° C.

A hole transporting layer may comprise or may consist of a hole-transporting polymer, which may be a homopolymer or copolymer comprising two or more different repeat units.

The hole-transporting polymer may be conjugated or non-conjugated. Exemplary conjugated hole-transporting polymers are polymers comprising arylamine repeat units, for example as described in WO 99/54385 or WO 2005/049546 the contents of which are incorporated herein by reference. Conjugated hole-transporting copolymers comprising arylamine repeat units may have one or more co-repeat units selected from arylene repeat units, for example one or more repeat units selected from fluorene, phenylene, phenanthrene naphthalene and anthracene repeat units, each of which may independently be unsubstituted or substituted with one or more substituents, optionally one or more $C_{1-40}$ hydrocarbyl substituents.

If present, a hole transporting layer located between the anode and the light-emitting layer 105 preferably has a HOMO level of less than or equal to 5.5 eV, more preferably around 4.8-5.5 eV or 5.1-5.3 eV as measured by cyclic voltammetry. The HOMO level of the hole transport layer may be selected so as to be within 0.2 eV, optionally within 0.1 eV, of an adjacent layer in order to provide a small barrier to hole transport between these layers.

Preferably a hole-transporting layer, more preferably a crosslinked hole-transporting layer, is adjacent to the light-emitting layer 105.

A hole-transporting layer may consist essentially of a hole-transporting material or may comprise one or more further materials. A light-emitting material, optionally a phosphorescent material, may be provided in the hole-transporting layer.

A phosphorescent material may be covalently bound to a hole-transporting polymer as a repeat unit in the polymer backbone, as an end-group of the polymer, or as a side-chain of the polymer. If the phosphorescent material is provided in a side-chain then it may be directly bound to a repeat unit in the backbone of the polymer or it may be spaced apart from the polymer backbone by a spacer group. Exemplary spacer groups include $C_{1-20}$ alkyl and aryl-$C_{1-20}$ alkyl, for example phenyl-$C_{1-20}$ alkyl. One or more carbon atoms of an alkyl group of a spacer group may be replaced with O, S, C=O or COO.

Emission from a light-emitting hole-transporting layer and emission from light-emitting layer 105 may combine to produce white light.

Hole Injection Layers

A conductive hole injection layer, which may be formed from a conductive organic or inorganic material, may be provided between the anode 103 and the light-emitting layer 105 of an OLED as illustrated in FIG. 1 to assist hole injection from the anode into the layer or layers of semi-conducting polymer. Examples of doped organic hole injection materials include optionally substituted, doped poly (ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Encapsulation

The film of the n-dopant reagent and the organic semiconductor is preferably exposed to radiation to cause n-doping as described herein after encapsulation of the device containing the film to prevent ingress of moisture and oxygen.

Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

The substrate on which the device is formed preferably has good barrier properties such that the substrate together with the encapsulant form a barrier against ingress of moisture or oxygen. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

Formulation Processing

Light-emitting layer 105 and electron-injecting layer 107 may be formed by any method including evaporation and solution deposition methods. Solution deposition methods are preferred.

Formulations suitable for forming light-emitting layer 105 and electron-injecting layer 107 may each be formed from the components forming those layers and one or more suitable solvents.

Preferably, light-emitting layer 105 is formed by depositing a solution in which the solvent is one or more non-polar solvent materials, optionally benzenes substituted with one or more substituents selected from $C_{1-10}$ alkyl and $C_{1-10}$ alkoxy groups, for example toluene, xylenes and methylanisoles, and mixtures thereof.

Optionally, the film comprising the organic semiconductor and the n-dopant reagent that is irradiated to form the electron-injecting layer 107 is formed by depositing a solution.

Particularly preferred solution deposition techniques including printing and coating techniques such spin-coating, inkjet printing and lithographic printing.

Coating methods are particularly suitable for devices wherein patterning of the light-emitting layer is unnecessary—for example for lighting applications or simple monochrome segmented displays.

Printing methods are particularly suitable for high information content displays, in particular full colour displays. A device may be inkjet printed by providing a patterned layer over the anode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, slot die coating, roll printing and screen printing.

Applications

The doped organic semiconductor layer has been described with reference to the electron-injection layer of an organic light-emitting device, however it will be appreciated that the layer formed as described herein may be used in other organic electronic device, for example as an electron-extraction layer of an organic photovoltaic device or organic photodetector; as an auxiliary electrode layer of a n-type organic thin film transistor or as an n-type semiconductor in a thermoelectric generator.

Measurements

UV-visible absorption spectra of pristine and n-doped acceptor materials as described herein were measured by spin-coating onto glass substrates, either as blend with the dopant, or with an overlaying layer of dopant. The film thicknesses were in the range of 20-100 nm.

After spin-coating and drying, the polymer films were encapsulated in a glove box, in order to exclude any contact of the n-doped films with air.

After the encapsulation, UV-vis absorption measurements were conducted with a Carey-5000 Spectrometer, followed by successive exposures to visible light and repeat UV-VIS measurements.

HOMO, SOMO and LUMO levels as described anywhere herein are as measured by square wave voltammetry.

Equipment:

CHI660D Electrochemical workstation with software (IJ Cambria Scientific Ltd))

CHI 104 3 mm Glassy Carbon Disk Working Electrode (IJ Cambria Scientific Ltd))

Platinum wire auxiliary electrode

Reference Electrode (Ag/AgCl) (Havard Apparatus Ltd)

Chemicals

| | |
|---|---|
| Acetonitrile (Hi-dry anhydrous grade-ROMIL) | (Cell solution solvent) |
| Toluene (Hi-dry anhydrous grade) | (Sample preparation solvent) |
| Ferrocene - FLUKA | (Reference standard) |
| Tetrabutylammoniumhexafluorophosphate-FLUKA) | (Cell solution salt) |

Sample Preparation

The acceptor polymers were spun as thin films (~20 nm) onto the working electrode; the dopant material was measured as a dilute solution (0.3 w %) in toluene.

Electrochemical Cell

The measurement cell contains the electrolyte, a glassy carbon working electrode onto which the sample is coated as a thin film, a platinum counter electrode, and a Ag/AgCl reference glass electrode. Ferrocene is added into the cell at the end of the experiment as reference material (LUMO (ferrocene)=−4.8 eV).

Method for Measuring the SOMO Level of the Dopant Radical Generated from the n-dopant Reagent:

The ionization of the n-dopant results in the formation of an imidazolium cation. In order to determine the SOMO level of the corresponding imidazolium radical, the cations are first generated from neutral dopant molecules during an oxidative scan, which also allows determining the HOMO level of the neutral dopant molecule.

EXAMPLES

Materials

Doping of Polymer 1 and Polymer 2 by Dopant 1 was studied.

Polymer 1 was prepared by Suzuki polymerisation as described in WO 00/53656 of a 2,7-diboronic ester of 9,9-dioctyl fluorene and dibromobenzothiadiazole. Polymer 1 has a LUMO level of 2.9 eV.

Polymer 2 was prepared as described in WO 01/49768. Polymer 2 has a LUMO level of 3.1 eV.

Dopant 1 (1,3-Dimethyl-2-phenyl-2,3-dihydro-1H-benzoimidazole) was obtained from Sigma Aldrich. Dopant 1 has a SOMO level of 2.7 eV and a HOMO level of 4.7 eV.

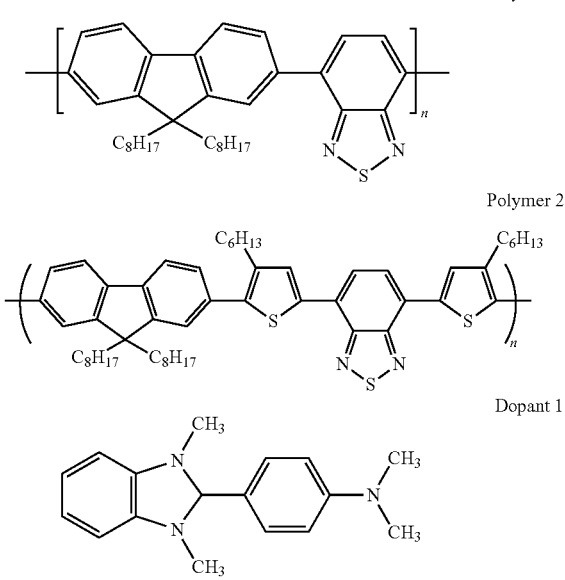

Figure 2:
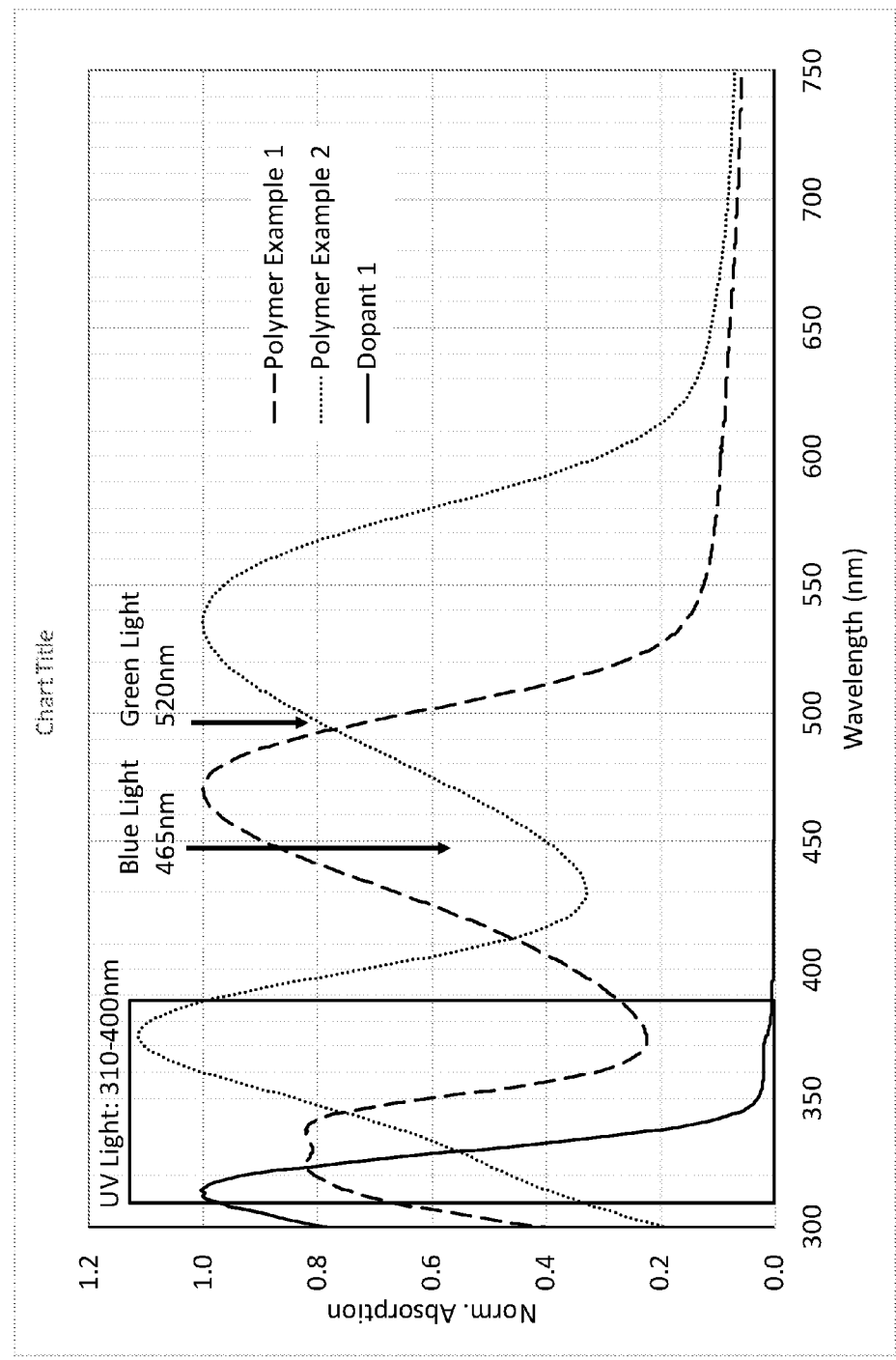
FIG. 2 shows the absorption spectra for a n-dopant reagent and for two semiconducting polymers.

FIG. 2 shows the UV-vis absorption spectra for Polymer 1, Polymer 2 and Dopant 1.

Polymer 1 has absorption peaks at around 330 nm and 470 nm.

Polymer 2 has absorption peaks at around 375 nm and 535 nm.

Doping Example 1

A formulation of Polymer 1 and Dopant 1 was deposited onto a glass layer by spin-coating to form a film which was irradiated with light having a peak wavelength of 465 nm for 2 hours.using the ENFIS UNO Air Cooled Light Engine available from Enfis Ltd, UK.

Figure 3:
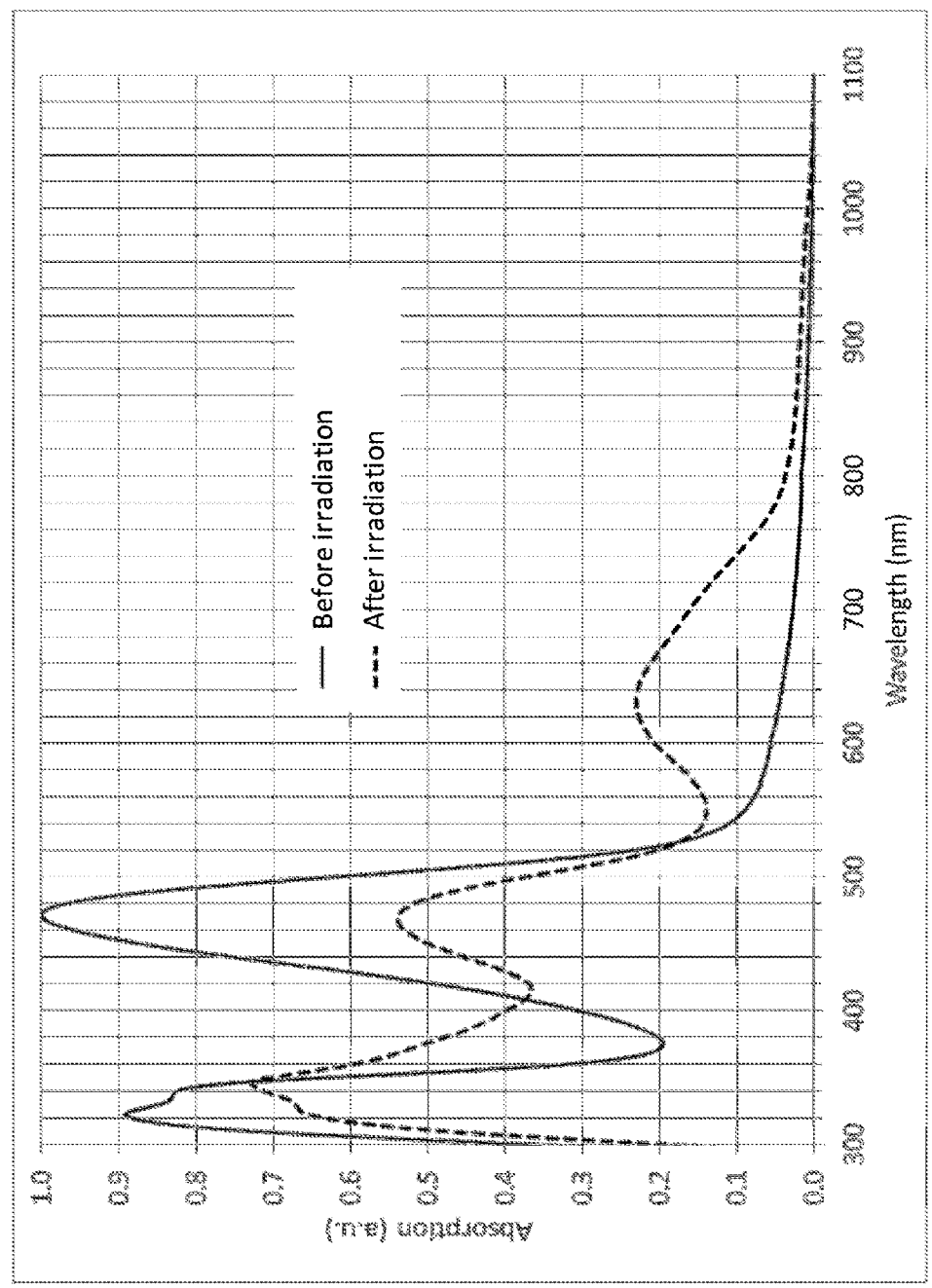
FIG. 3 shows the absorption spectra for a mixture of a n-dopant reagent and a first semiconducting polymer before and after irradiation.

The UV-vis spectrum of the film was measured before and after irradiation. The spectra are shown in FIG. 3 in which the solid line is the spectrum before irradiation and the dashed line is the spectrum after irradiation.

A broad, new peak appears in the wavelength range of 550 nm to 800 nm, together with a weak increase in absorption up to around 1000 nm.

These new absorption features at higher wavelengths are attributed to the creation of electronic gap states as a consequence of n-doping (polaron and/or bipolaron states).

Doping Example 2

A formulation of Polymer 2 and Dopant 1 was deposited onto a glass layer by spin-coating to form a film which was irradiated with light having a peak wavelength of 465 nm for 2 hours using the ENFIS UNO Air Cooled Light Engine available from Enfis Ltd, UK.

Doping Example 3

A formulation was deposited and irradiated as described in Doping Example 2 except that the film was with light having a peak wavelength of 520 nm for 2 hours using the ENFIS UNO Air Cooled Light Engine available from Enfis Ltd, UK.

Figure 4:
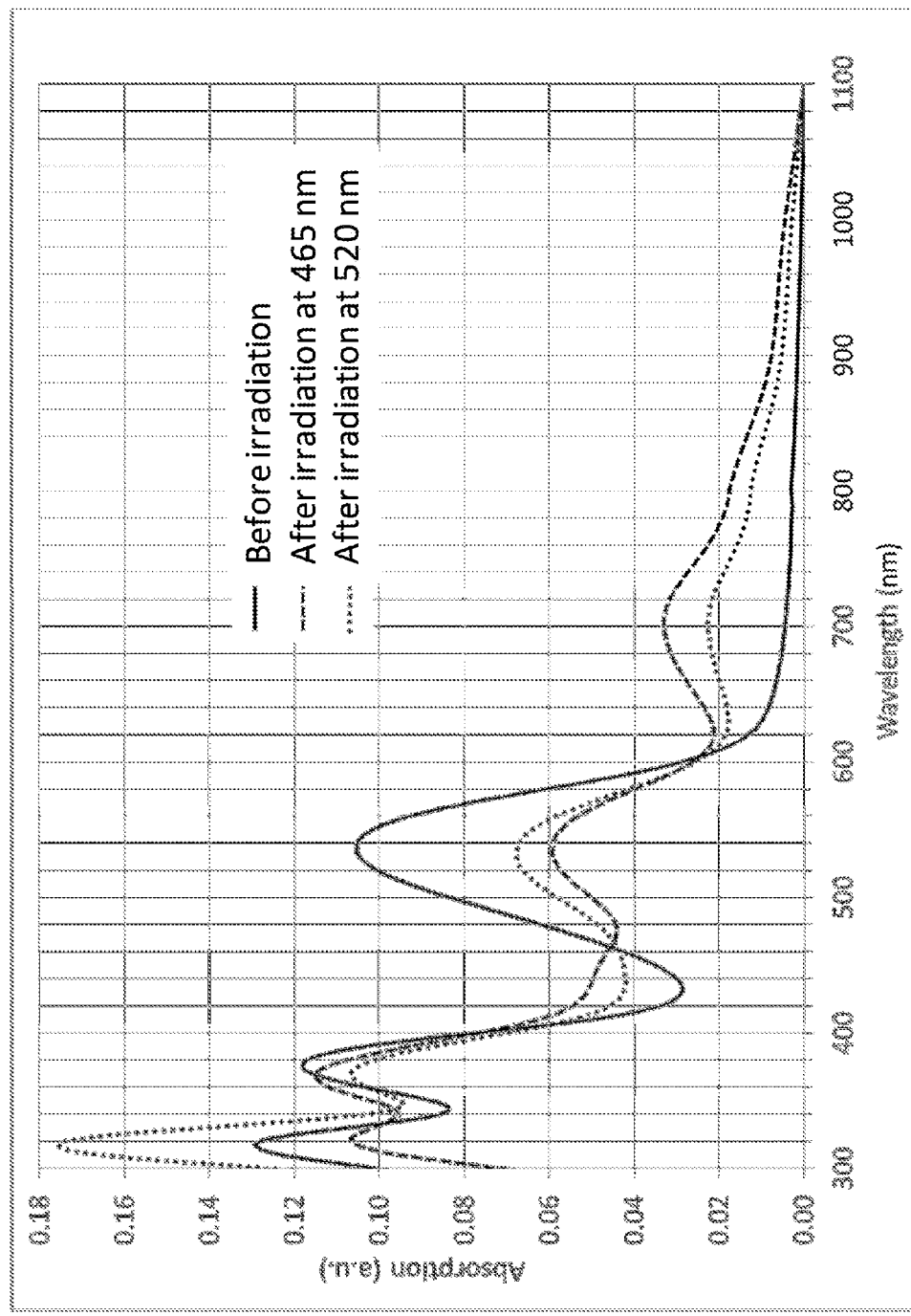
FIG. 4 shows the absorption spectra for a mixture of a n-dopant reagent and a second semiconducting polymer before and after irradiation.

The UV-vis spectra of the films of Doping Examples 2 and 3 were measured before and after irradiation. The spectra are shown in FIG. 4 in which the solid line is the spectrum before irradiation; the dashed line is the spectrum after irradiation at 465 nm (Doping Example 2) and the dotted line is the spectrum after irradiation at 520 nm (Doping Example 3).

As with Doping Example 1, the new peaks appearing at about 600 nm are attributed to n-doping.

Device Example 1

An electron-only device having the following structure was prepared:
Glass substrate/ITO/Donor-Acceptor Layer/Ag The Donor-Acceptor layer was formed by spin-coating a 1 wt % formulation of Polymer 1: Dopant 1 (99:1 wt %) in o-xylene to a thickness of about 100 nm. The cathode was formed by evaporation of silver to a thickness of about 100 nm.

The device was irradiated through the substrate using light having a peak wavelength of 465 nm using the ENFIS UNO Air Cooled Light Engine available from Enfis Ltd, UK.

Figure 5:
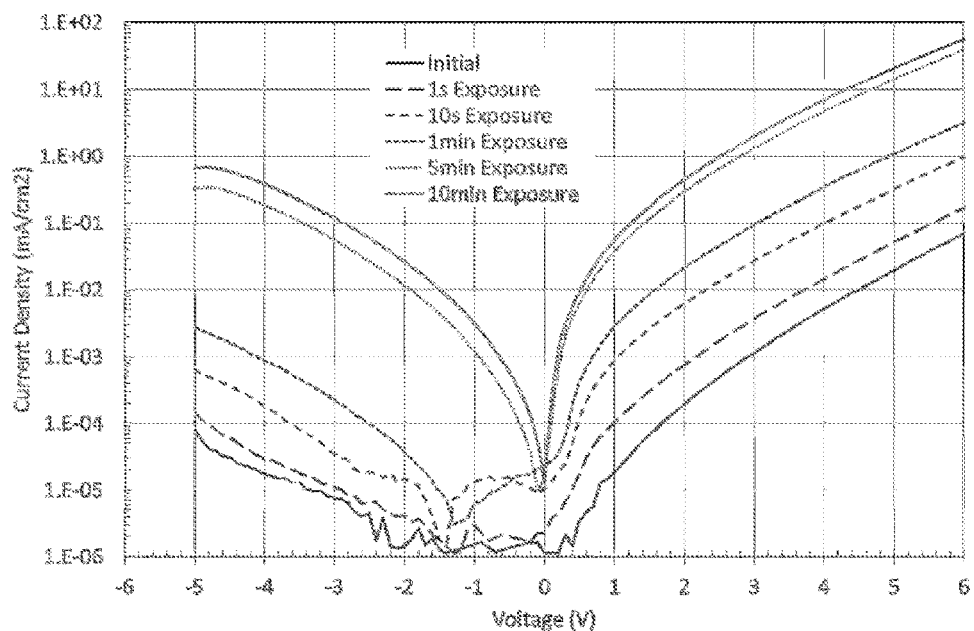
FIG. 5 is a graph of current density vs. voltage for electron-only devices comprising a a layer of organic semiconductor n-doped according to an embodiment of the invention by irradiation for different lengths of time.

Current-voltage characteristics of the device were measured before irradiation and after irradiation for 1 second, 10 seconds, 1 minute, 5 minutes and 10 minutes and are shown in FIG. 5.

The current density of an electron-only device as described herein may be used to determine the extent of doping of the organic semiconductor, the current density being proportional to the extent of doping.

Device Example 2

An electron-only device was prepared as described for Device Example 1 except that the Polymer 1: Dopant 1 ratio was 95:5 wt % and the irradiation time was 30 minutes.

Figure 6:
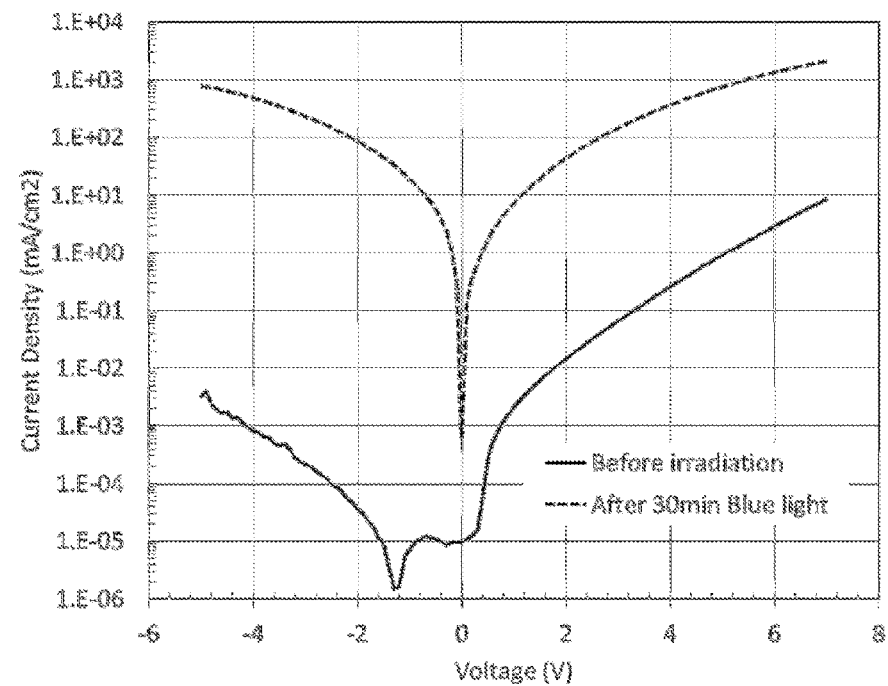
FIG. 6 is a graph of current density vs. voltage for an electron-only device comprising a a layer of organic semiconductor n-doped according to an embodiment of the invention before and after irradiation.

The current density vs. voltage for this device is shown in FIG. 6. For this device, diode characteristics are lost indicating that the donor-acceptor layer is a degenerate semiconductor layer.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A composition comprising: (a) an organic semiconductor comprising a unit comprising one or more of a C=N group, a nitrile group, a C=O group and a C=S group and (b) an n-dopant reagent comprising a 2,3-dihydro-benzoimidazole group.

2. A composition according to claim 1 wherein the n-dopant reagent comprises a 2,3-dihydro-1H-benzoimidazole group.

3. A composition according to claim 1 wherein the n-dopant reagent is a compound of formula (I):

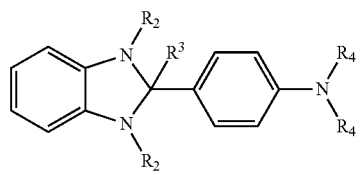

(I)

wherein:
each $R^2$ is independently a $C_{1\text{-}20}$ hydrocarbyl group;
$R^3$ is H or a $C_{1\text{-}20}$ hydrocarbyl group; and
each $R^4$ is independently a $C_{1\text{-}20}$ hydrocarbyl group.

4. A composition according to claim 1 wherein the organic semiconductor is a polymer.

5. A composition according claim 1 wherein the organic semiconductor comprises a benzothiadiazole group.

6. A composition according to claim 1 wherein the n-dopant reagent is (4-(1,3-dimethyl-2,3-dihydro-1H-benzoimidazol-2-yl)phenyl)dimethylamine.

7. A method of forming a n-doped semiconductor layer from a composition according to claim 1, the method comprising the step of exciting the organic semiconductor.

8. A method according to claim 7 wherein the organic semiconductor is excited by thermal treatment or electromagnetic irradiation.

9. A method according to claim 7 wherein the n-dopant reagent is (4-(1,3-dimethyl-2,3-dihydro-1H-benzoimidazol-2-yl)phenyl)dimethylamine.

* * * * *